United States Patent
Nagata

(10) Patent No.: US 8,242,499 B2
(45) Date of Patent: Aug. 14, 2012

(54) METHOD OF PRODUCING SEMICONDUCTOR DEVICE AND SOQ (SILICON ON QUARTZ) SUBSTRATE USED IN THE METHOD

(75) Inventor: Toshio Nagata, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 140 days.

(21) Appl. No.: 12/619,835

(22) Filed: Nov. 17, 2009

(65) Prior Publication Data

US 2010/0123134 A1    May 20, 2010

(30) Foreign Application Priority Data

Nov. 18, 2008  (JP) ................................. 2008-294921

(51) Int. Cl.
*H01L 21/66*    (2006.01)
(52) U.S. Cl. ............ 257/48; 257/16; 257/620; 257/486; 257/E23; 257/786; 257/E21.53; 257/E23.179
(58) Field of Classification Search ..................... 257/48, 257/E21.53, E23.179, 620, 486, E23, 786; 438/16
See application file for complete search history.

(56) References Cited

U.S. PATENT DOCUMENTS

| | | | | |
|---|---|---|---|---|
| 6,649,986 | B1 * | 11/2003 | Ishizaki et al. | 257/415 |
| 7,075,704 | B2 * | 7/2006 | Kurashina | 359/321 |
| 2004/0184131 | A1 * | 9/2004 | Kurashina | 359/245 |
| 2006/0202201 | A1 * | 9/2006 | Maruyama | 257/48 |
| 2008/0217786 | A1 * | 9/2008 | Kasaoka et al. | 257/773 |

FOREIGN PATENT DOCUMENTS

JP    2008-147227 A    6/2008

* cited by examiner

*Primary Examiner* — Marc Armand
(74) *Attorney, Agent, or Firm* — Kubotera & Associates, LLC

(57) ABSTRACT

A method of producing a semiconductor device includes the steps of preparing an SOQ (Silicon On Quartz) substrate in which a semiconductor layer is formed on a quartz substrate; forming a plurality of semiconductor device forming regions in the SOQ substrate; forming a crack inspection pattern in the SOQ substrate; inspecting the crack inspection pattern to detect a crack in the crack inspection pattern in a first inspection step; and inspecting the semiconductor device forming regions to detect a crack in the semiconductor device forming regions in a second inspection step when the crack is detected in the crack inspection pattern in the first inspection step.

6 Claims, 6 Drawing Sheets

… (1) …

METHOD OF PRODUCING SEMICONDUCTOR DEVICE AND SOQ (SILICON ON QUARTZ) SUBSTRATE USED IN THE METHOD

BACKGROUND OF THE INVENTION AND RELATED ART STATEMENT

The present invention relates to a method of producing a semiconductor device using an SOQ (Silicon On Quartz) substrate in which a semiconductor layer is formed on a quartz substrate, and to the SOQ substrate used in the method. More specifically, the present invention relates to a method of producing a semiconductor device applicable to a transmission projector and an SOQ substrate used in the method.

A conventional SOQ substrate is formed of a quartz substrate (an insulating substrate) and a silicon layer formed on the quartz substrate. A completely depleted transistor formed of the conventional SOQ substrate provides a low S value and a low substrate floating effect. Further, the completely depleted transistor provides advantages such as a low connection capacity, a high operation speed, low power consumption, and excellent radiation resistance.

Patent Reference has disclosed a structure in which a conventional SOQ substrate is formed of a quartz substrate and a silicon layer formed on the quartz substrate. Patent Reference has also disclosed a TFT (Thin Film Transistor) formed on the conventional SOQ substrate.

Patent Reference: Japanese Patent Publication No. 2008-147227

In general, quartz has hardness lower than that of silicon, and a smaller thermal expansion coefficient as compared with silicon. Accordingly, quartz tends to expand or contract more easily due to a difference in the thermal expansion coefficient. Especially when a film with high tension stress is formed on a quartz substrate, the quartz substrate is difficult to withstand the tension stress, thereby causing a crack in a contact region on the quartz substrate.

Such a crack tends to occur in a shallow and fine region, so that it is difficult to detect the crack with naked eyes or visual inspection. In order to secure device quality management and reliability, it is imperative to accurately detect a crack. Accordingly, it has been required as a technical issue to establish a reliable method of detecting a crack.

In the past, an entire portion of a wafer is inspected to detect a crack on a device. As explained above, however, it is difficult to detect a crack, thereby increasing time and cost for inspecting a large number of wafers.

In view of the problems described above, an object of the present invention is to provide a method of producing a semiconductor device capable of solving the problems of the conventional technology. In the invention, it is possible to easily detect a crack on an SOQ substrate. Another object of the present invention is to provide an SOQ substrate capable of easily detecting a crack.

Further objects and advantages of the invention will be apparent from the following description of the invention.

SUMMARY OF THE INVENTION

In order to attain the objects described above, according to a first aspect of the present invention, a method of producing a semiconductor device includes the steps of: preparing an SOQ (Silicon On Quartz) substrate in which a semiconductor layer is formed on a quartz substrate; forming a plurality of semiconductor device forming regions and a crack inspection pattern; inspecting the crack inspection pattern to detect a crack in the crack inspection pattern in a first inspection step; and inspecting the semiconductor device forming regions to detect a crack in the semiconductor device forming regions in a second inspection step when the crack is detected in the crack inspection pattern in the first inspection step.

According to a second aspect of the present invention, an SOQ (Silicon On Quartz) substrate includes a plurality of semiconductor device forming regions and a crack inspection pattern.

In the present invention, the crack inspection pattern formed on the SOQ substrate is inspected in the first inspection step. When the crack is detected in the crack inspection pattern, it is determined that there is a possibility of a crack in the semiconductor device forming regions. Accordingly, the semiconductor device forming regions are inspected in the second inspection step. In general, when the crack is not detected in the crack inspection pattern, a possibility of a crack in the semiconductor device forming regions is very low. Accordingly, it is possible to omit detailed inspection. With the first inspection step and the second inspection step, it is possible to improve inspection efficiency.

DETAILED DESCRIPTION OF PREFERRED EMBODIMENTS

Hereunder, preferred embodiments of the present invention will be explained with reference to the accompanying drawings.

First Embodiment

Figure 1:
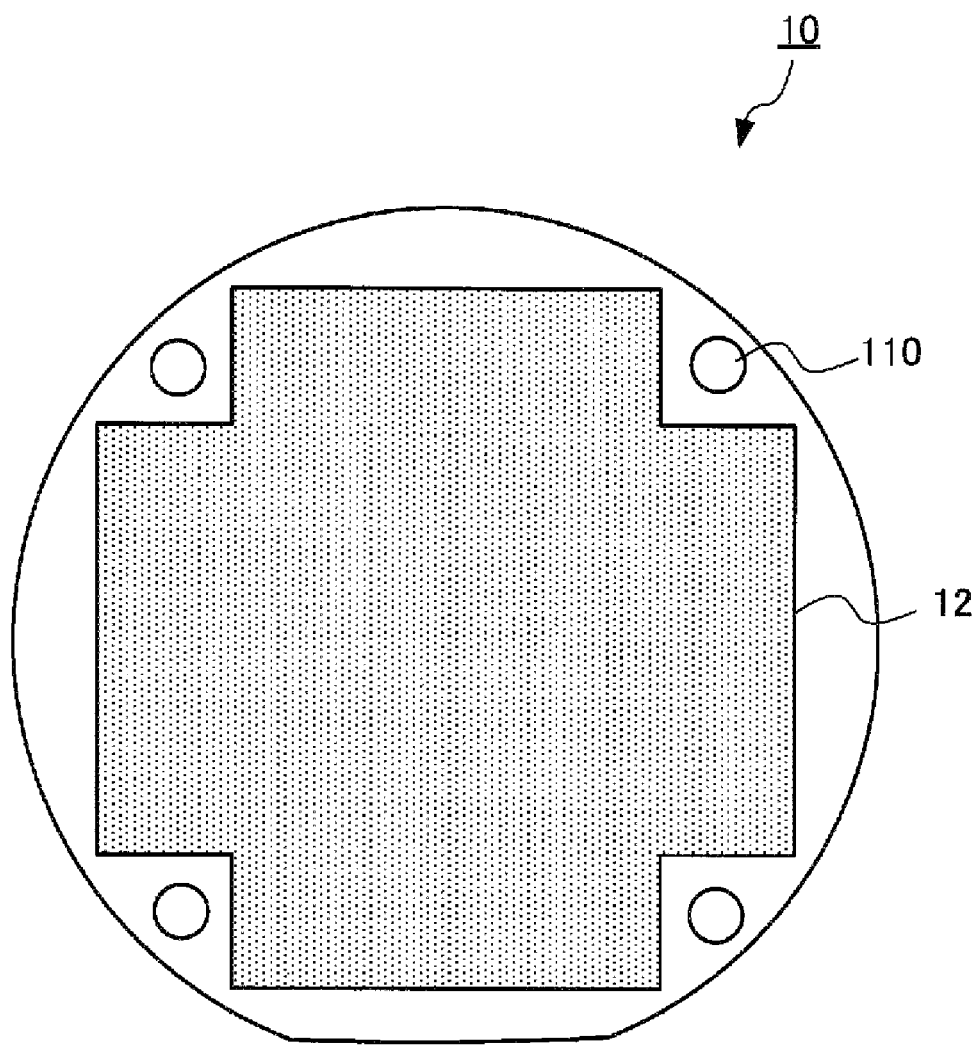
FIG. 1 is a schematic plan view showing an SOQ (Silicon On Quartz) substrate according to a first embodiment of the present invention.

A first embodiment of the present invention will be explained. FIG. 1 is a schematic plan view showing an SOQ (Silicon On Quartz) substrate 10 according to the first embodiment of the present invention.

As shown in FIG. 1, the SOQ substrate 10 includes a plurality of semiconductor device forming regions 12 for forming a plurality of semiconductor devices and crack inspection patterns 110.

In the embodiment, the crack inspection patterns 110 are disposed at four corners of a wafer outside the semiconductor device forming regions 12. When the crack inspection patterns 110 are disposed outside the semiconductor device forming regions 12, it is possible to prevent a crack generated in the crack inspection patterns 110 from reaching the semiconductor device forming regions 12.

Further, when the crack inspection patterns 110 are disposed at the four corners of the wafer, it is possible to effectively detect a crack over an entire surface of the wafer. For example, when a crack is detected in one of the crack inspection patterns 110 disposed at the four locations, it is possible to inspect the semiconductor devices near the one of the crack inspection patterns 110 first, thereby improving inspection efficiency. Note that the number and the locations of the crack inspection patterns 110 can be arbitrarily adjusted.

Figure 2:
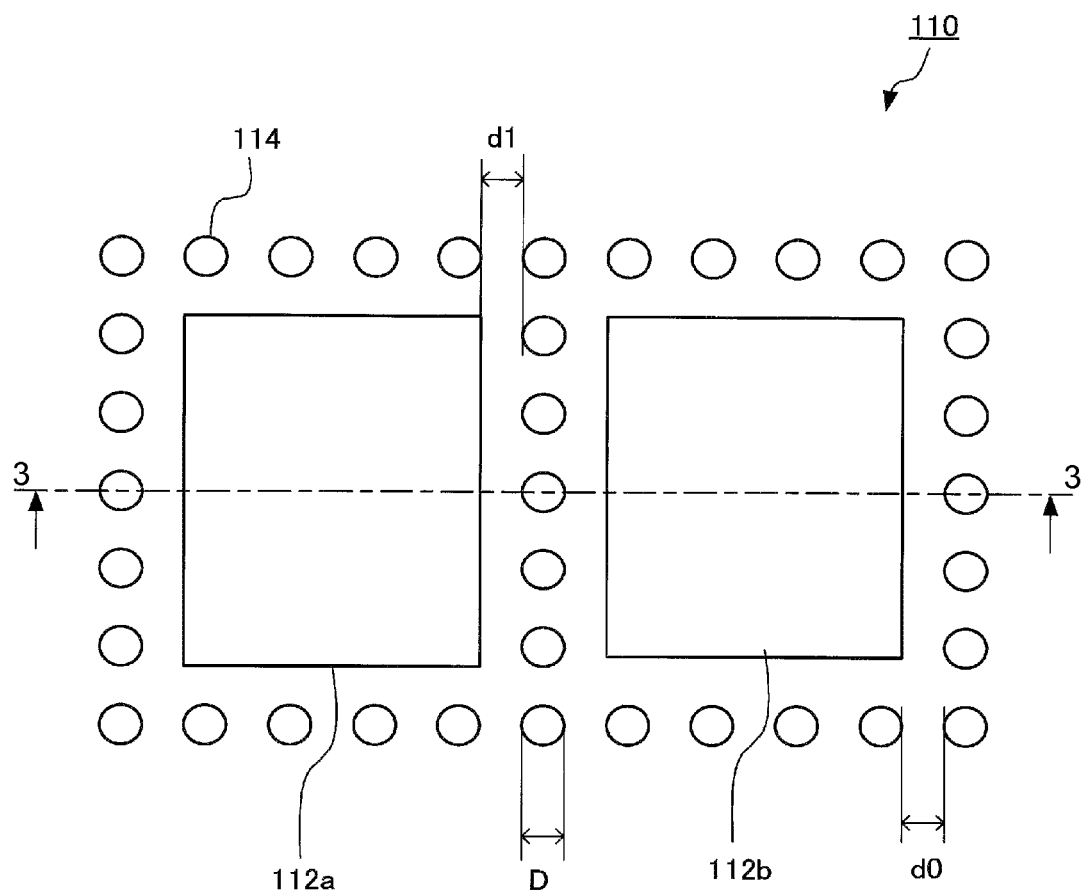
FIG. 2 is a schematic plan view showing a crack inspection pattern according to the first embodiment of the present invention.

FIG. 2 is a schematic plan view showing the crack inspection pattern 110 according to the first embodiment of the present invention. In the embodiment, the crack inspection patterns 110 have a structure in which a crack is generated more easily than in the semiconductor device forming regions 12.

More specifically, as shown in FIG. 2, the crack inspection patterns 110 includes large area gates 112a and 112b having an area larger than that of a gate to be formed in the semiconductor device forming regions 12. Further, the crack inspection patterns 110 includes a plurality of contacts 114 arranged in parallel near the large area gates 112a and 112b.

In the embodiment, the large area gates 112a and 112b sandwich one row of the contacts 114. Further, the contacts 114 are arranged to surround circumferences of the large area gates 112a and 112b.

In the embodiment, as an example, the large area gates 112a and 112b have an area of 0.5 mm$^2$, and the contacts 114 have a diameter D of about 0.7 μm. Further, the contacts 114 are arranged with a distance d0 of 0.5 μm to 0.7 μm in between, and are away from the large area gates 112a and 112b by a distance d1 of less than 1.0 μm. The distance d0 between the contacts 114 and the distance d1 between the large area gates 112a and 112b and the contacts 114 are set to be smaller than a circuit element to be formed in the semiconductor device forming regions 12.

When a crack is generated in the SOQ substrate 10, a location of the crack depends on a pattern on the SOQ substrate 10. Especially a portion where the contacts 114 are arranged in a row, a crack tends to occur more easily. Further, when the contacts 114 are situated near the large area gates 112a and 112b, a crack tends to occur further more easily.

FIGS. 3(A) to 3(E) are schematic sectional views showing a process of forming the inspection pattern taken along a line 3-3 in FIG. 2 according to the first embodiment of the present invention.

Figure 3A:
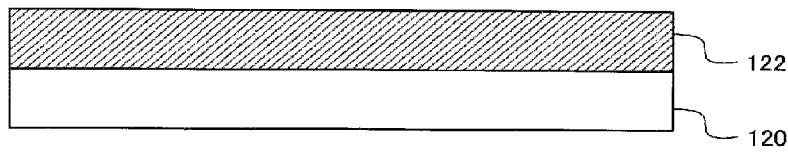
FIGS. 3(A) to 3(E) are schematic sectional views showing a process of forming the inspection pattern taken along a line 3-3 in FIG. 2 according to the first embodiment of the present invention.
Figure 3B:
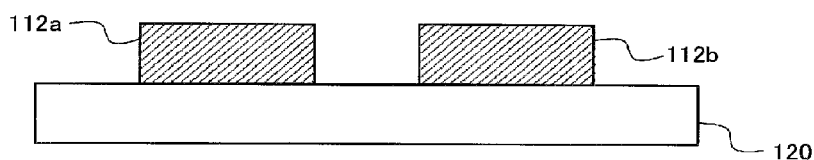

As shown in FIG. 3(A), first, a poly-silicon layer 122 is formed on a quartz substrate 120. In the next step, as shown in FIG. 3(B), the large area gates 112a and 112b are formed through photolithography and etching.

Figure 3C:
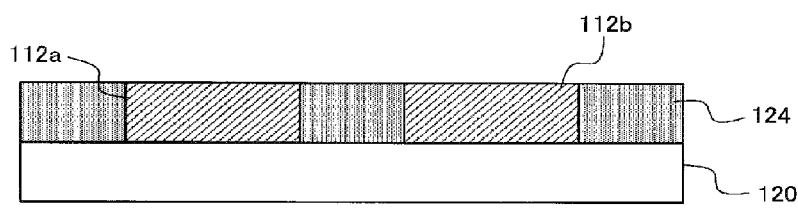
Figure 3D:
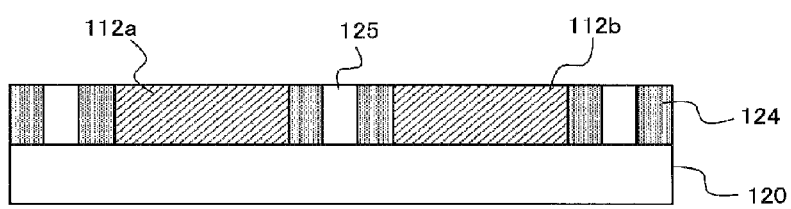
Figure 3E:
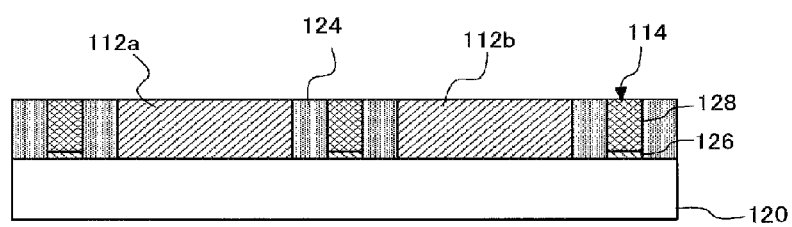

In the next step, as shown in FIG. 3(C), an intermediate insulation film 124 is formed on an entire surface of the quartz substrate 120. Afterward, as shown in FIG. 3(D), contact holes 125 are formed in the intermediate insulation film 124 through photolithography and etching. Then, as shown in FIG. 3(E), barrier metal portions 126 formed of Ti or TiN and embedded tungsten portions 128 are laminated in the contact holes 125 to form the contacts 114.

In the embodiment, the crack inspection patterns 110 formed on the SOQ substrate 10 are inspected to detect a crack. When the crack is detected in the crack inspection patterns 110, it is determined that there is a possibility of a crack in the semiconductor device forming regions 12, so that the semiconductor device forming regions 12 are thoroughly inspected to detect a crack. When the crack is not detected in the crack inspection patterns 110, a possibility of the crack in the semiconductor device forming regions is very low. Accordingly, it is possible to omit detailed inspection. With the two-stage inspection steps described above, it is possible to improve inspection efficiency.

Second Embodiment

Figure 4:
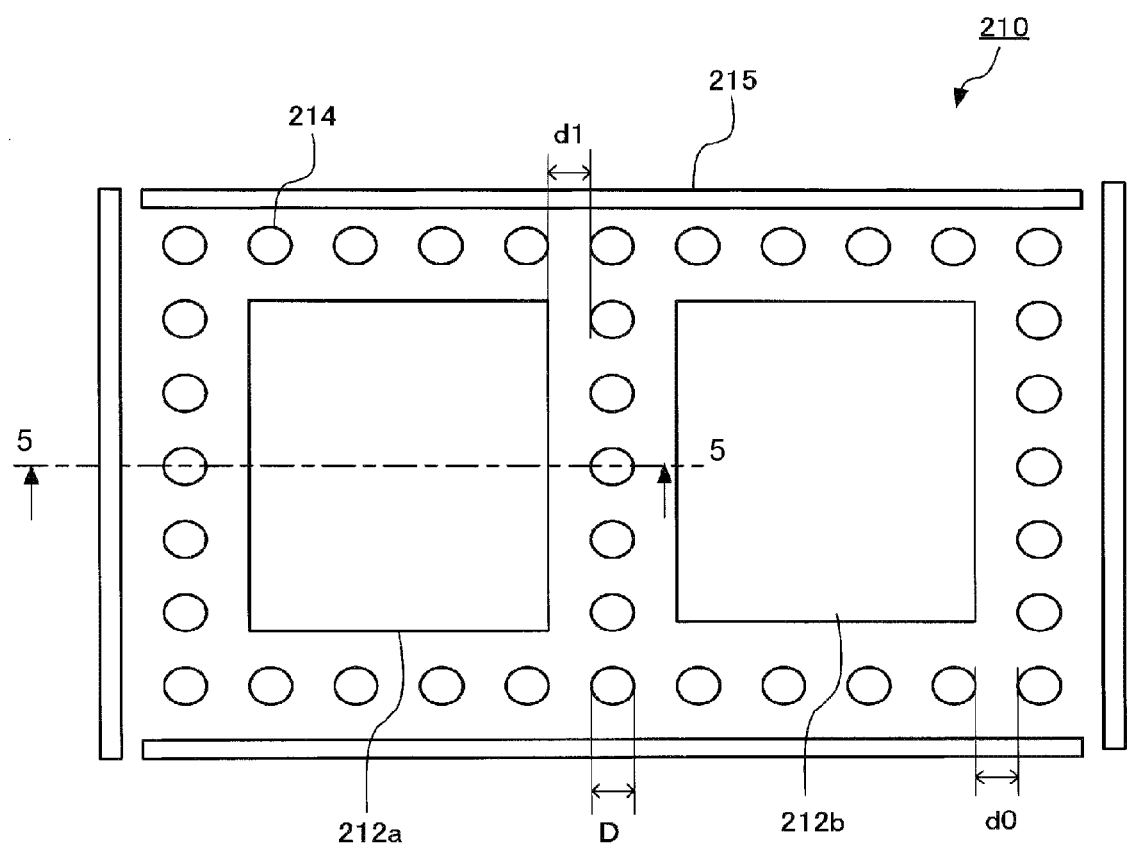
FIG. 4 is a schematic plan view showing a crack inspection pattern according to a second embodiment of the present invention.

A second embodiment of the present invention will be explained next. FIG. 4 is a schematic plan view showing a crack inspection pattern 210 according to a second embodiment of the present invention. In the embodiment, the crack inspection patterns 210 have a structure in which a crack is generated more easily than in the semiconductor device forming regions 12.

More specifically, as shown in FIG. 4, the crack inspection patterns 210 includes large area gates 212a and 212b having an area larger than that of a gate (not shown) to be formed in the semiconductor device forming regions 12. Further, the crack inspection patterns 210 includes a plurality of contacts 214 arranged in parallel near the large area gates 212a and 212b.

In the embodiment, the large area gates 212a and 212b sandwich one row of the contacts 214. Further, the contacts 214 are arranged to surround circumferences of the large area gates 212a and 212b.

In the embodiment, as an example, the large area gates 212a and 212b have an area of 0.5 mm$^2$, and the contacts 214 have a diameter D of about 0.7 μm. Further, the contacts 214 are arranged with a distance d0 of 0.5 μm to 0.7 μm in between, and are away from the large area gates 212a and 212b by a distance d1 of less than 1.0 μm.

When a crack is generated in the SOQ substrate 10, a location of the crack depends on a pattern on the SOQ substrate 10. Especially a portion where the contacts 114 are arranged in a row, a crack tends to occur more easily. Further, when the contacts 114 are situated near the large area gates 112a and 112b, a crack tends to occur further more easily.

In the embodiment, the crack inspection patterns 210 further includes four guard regions 215 arranged on an extension line of the contacts 214 for preventing a crack from propagating.

FIGS. 5(A) to 5(E) are schematic sectional views showing a process of forming the inspection pattern taken along a line 5-5 in FIG. 4 according to the second embodiment of the present invention.

Figure 5A:
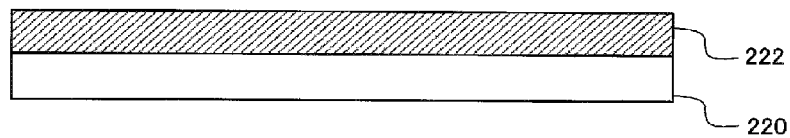
FIGS. 5(A) to 5(E) are schematic sectional views showing a process of forming the inspection pattern taken along a line 5-5 in FIG. 4 according to the second embodiment of the present invention.
Figure 5B:
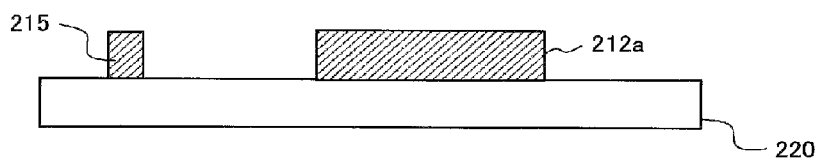

As shown in FIG. 5(A), first, a poly-silicon layer 222 is formed on a quartz substrate 220. In the next step, as shown in FIG. 5(B), the large area gate 112a and the guard region 215 are formed through photolithography and etching.

Figure 5C:
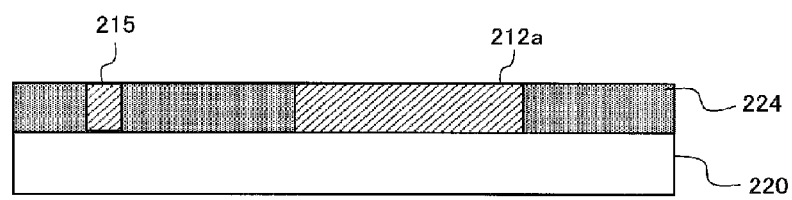
Figure 5D:
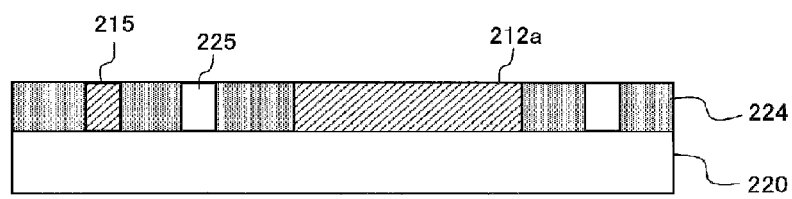
Figure 5E:
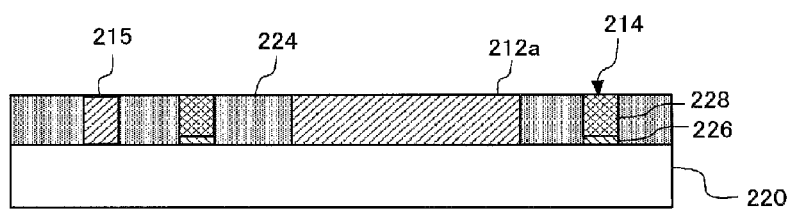

In the next step, as shown in FIG. 5(C), an intermediate insulation film 224 is formed on an entire surface of the quartz substrate 220. Afterward, as shown in FIG. 5(D), contact holes 225 are formed in the intermediate insulation film 224 through photolithography and etching. Then, as shown in FIG. 5(E), barrier metal portions 226 formed of Ti or TiN and embedded tungsten portions 228 are laminated in the contact holes 225 to form the contacts 214.

In the embodiment, the crack inspection patterns 210 formed on the SOQ substrate 10 are inspected to detect a crack. When the crack is detected in the crack inspection patterns 210, it is determined that there is a possibility of a crack in the semiconductor device forming regions 12, so that the semiconductor device forming regions 12 are thoroughly inspected to detect a crack. When the crack is not detected in the crack inspection patterns 210, a possibility of the crack in the semiconductor device forming regions is very low.

Accordingly, it is possible to omit detailed inspection. With the two-stage inspection steps, it is possible to improve inspection efficiency.

When a crack is generated in the crack inspection patterns 210, the crack tends to propagate in a lateral direction (an X-Y direction of the wafer). In the embodiment, the guard regions 215 are provided for preventing the crack from propagating in to an actual product (the semiconductor device forming regions 12). Further, the guard regions 215 prevent a crack from propagating in the lateral direction. Accordingly, it is possible to dispose the crack inspection patterns 210 in an effective product chip (the semiconductor device forming regions 12).

Figure 6:
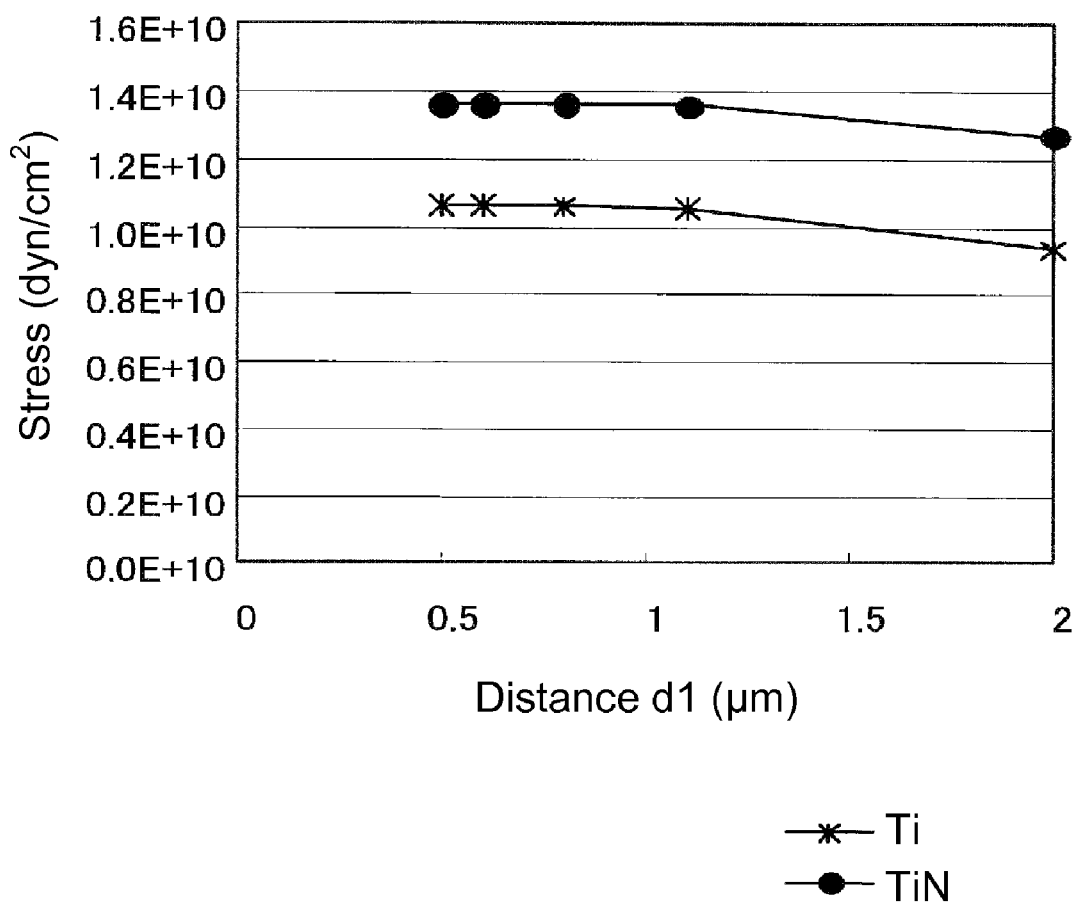
FIG. 6 is a graph showing a stress and a distance between a gate and a contact according to the present invention.

FIG. 6 is a graph showing a stress and the distance d1 between the large area gates (112a and 112b or 212a and 212b) and the contacts (114 or 214) according to the present invention.

As shown in FIG. 6, when the distance d1 between the large area gates (112a and 112b or 212a and 212b) and the contacts (114 or 214) is less than 1 µm, the stress generated in the SOQ substrate 10 increases, thereby making the SOQ substrate 10 more prone to cracking. The phenomenon is common in cases that the barrier metal portions (126 or 226) are formed of Ti and TiN.

The disclosure of Japanese Patent Application No. 2008-294921, filed on Nov. 18, 2008, is incorporated in the application by reference.

While the invention has been explained with reference to the specific embodiments of the invention, the explanation is illustrative and the invention is limited only by the appended claims.

What is claimed is:

1. An SOQ (Silicon On Quartz) substrate comprising:
   a quartz substrate;
   a semiconductor layer formed on the quartz substrate;
   a plurality of semiconductor device forming regions; and
   a crack inspection pattern,
   wherein said crack inspection pattern includes a large area gate having an area larger than that of a gate to be formed in the semiconductor device forming regions, and a contact arranged adjacent to the large area gate.

2. The SOQ substrate according to claim 1, wherein said crack inspection pattern has a structure in which the crack is generated more easily than in the semiconductor device forming regions.

3. The SOQ substrate according to claim 1, wherein said contact is situated at a plurality of locations arranged in a row.

4. The SOQ substrate according to claim 1, wherein said crack inspection pattern further includes a guard region for preventing a crack from propagating.

5. The SOQ substrate according to claim 1, wherein said crack inspection pattern is situated in a region different from the semiconductor device forming regions.

6. The SOQ substrate according to claim 1, wherein said crack inspection pattern is situated within the semiconductor device forming regions.

* * * * *